（12）United States Patent
Schmid et al.

(10) Patent No.: US 10,030,307 B2
(45) Date of Patent: Jul. 24, 2018

(54) APPARATUS AND PROCESS FOR PRODUCING THIN LAYERS

(75) Inventors: Christian Schmid, Freudenstadt (DE);
Dirk Habermann, Kirchzarten (DE);
Jurgen Haungs, Freudenstadt (DE);
Chuck Attema, Santa Cruz, CA (US);
Tom Stewart, Santa Cruz, CA (US);
Kenneth Provancha, Soquel, CA (US)

(73) Assignee: Gebr. Schmid GmbH, Freudenstadt (DE)

( * ) Notice: Subject to any disclaimer, the term of this patent is extended or adjusted under 35 U.S.C. 154(b) by 398 days.

(21) Appl. No.: 14/235,998

(22) PCT Filed: Jul. 26, 2012

(86) PCT No.: PCT/EP2012/064653
§ 371 (c)(1),
(2), (4) Date: Aug. 28, 2014

(87) PCT Pub. No.: WO2013/017514
PCT Pub. Date: Feb. 7, 2013

(65) Prior Publication Data
US 2015/0024540 A1    Jan. 22, 2015

(30) Foreign Application Priority Data
Aug. 1, 2011    (DE) .................. 10 2011 080 202

(51) Int. Cl.
*C23C 16/54* (2006.01)
*C23C 16/455* (2006.01)
(Continued)

(52) U.S. Cl.
CPC .......... *C23C 16/54* (2013.01); *C23C 16/0209* (2013.01); *C23C 16/4408* (2013.01);
(Continued)

(58) Field of Classification Search
CPC ............ C23C 16/453; C23C 16/45521; C23C 16/45595; C23C 16/458; C23C 16/4581;
(Continued)

(56) References Cited

U.S. PATENT DOCUMENTS 3,963,938 A * 6/1976 Sanglert .................. B27B 31/06
144/357
4,834,020 A * 5/1989 Bartholomew ... C23C 16/45519
118/715
(Continued)

FOREIGN PATENT DOCUMENTS

DE    10 2008 030 677 A1    10/2009
DE    10 2008 030 679 A1    12/2009
(Continued)

OTHER PUBLICATIONS

International Search Report issued in connection with PCT/EP2012/064653.
(Continued)

*Primary Examiner* — Sophia Nguyen
(74) *Attorney, Agent, or Firm* — Akerman LLP

(57) ABSTRACT

In an apparatus for producing thin layers on substrates for solar cell production, wherein the thin layers are applied by an APCVD process at temperatures of more than 250° C., the substrates are conveyed on a horizontal conveyor path and coated by means of an APCVD coating in continuous operation. The conveyor path has conveyor rollers, which consist of a temperature-resistant, non-metallic material, preferably of ceramic. A heating device and/or a purge gas feeding device is/are arranged on that side of the conveyor path which is remote from the coating apparatus.

12 Claims, 3 Drawing Sheets

Figure 1:
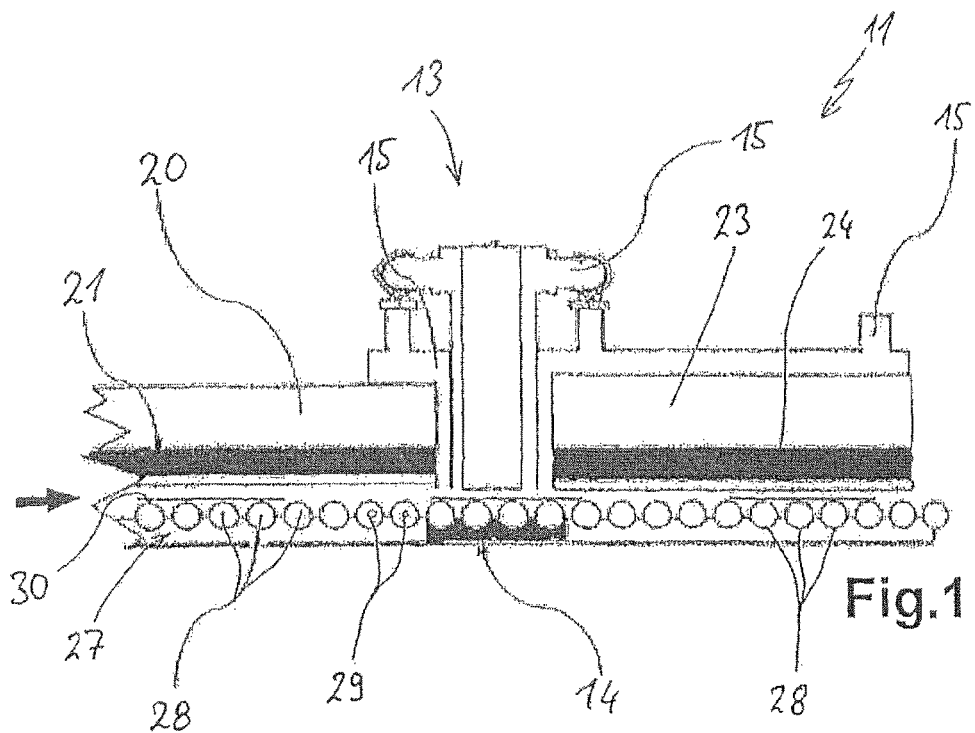

US 10,030,307 B2
Page 2

(51) Int. Cl.
| | |
|---|---|
| *C23C 16/44* | (2006.01) |
| *H01L 31/20* | (2006.01) |
| *C23C 16/02* | (2006.01) |
| *C23C 16/46* | (2006.01) |
| *C23C 16/458* | (2006.01) |
| *H01L 21/67* | (2006.01) |
| *H01L 21/677* | (2006.01) |
| *H01L 31/0224* | (2006.01) |
| *H01L 31/18* | (2006.01) |
| *C23C 16/453* | (2006.01) |
| *H01L 31/0216* | (2014.01) |
| *C23C 16/34* | (2006.01) |
| *C23C 16/40* | (2006.01) |
| *H01L 21/02* | (2006.01) |

(52) U.S. Cl.
CPC ........ *C23C 16/4412* (2013.01); *C23C 16/453* (2013.01); *C23C 16/458* (2013.01); *C23C 16/4551* (2013.01); *C23C 16/4557* (2013.01); *C23C 16/4558* (2013.01); *C23C 16/4581* (2013.01); *C23C 16/45521* (2013.01); *C23C 16/45578* (2013.01); *C23C 16/45595* (2013.01); *C23C 16/466* (2013.01); *C23C 16/545* (2013.01); *H01L 21/6776* (2013.01); *H01L 21/67115* (2013.01); *H01L 21/67706* (2013.01); *H01L 31/02167* (2013.01); *H01L 31/022425* (2013.01); *H01L 31/18* (2013.01); *H01L 31/1884* (2013.01); *H01L 31/206* (2013.01); *C23C 16/345* (2013.01); *C23C 16/402* (2013.01); *C23C 16/403* (2013.01); *H01L 21/02271* (2013.01); *H01L 31/02168* (2013.01); *Y02E 10/50* (2013.01)

(58) Field of Classification Search
CPC ..... C23C 16/54; C23C 16/545; C23C 16/402; C23C 16/345; C23C 16/403; C23C 16/0209; C23C 16/4408; C23C 16/4412; C23C 16/4551; C23C 16/4558; C23C 16/45578; C23C 16/466; H01L 21/67115; H01L 21/67706; H01L 21/6776; H01L 31/02167; H01L 31/022425; H01L 31/18; H01L 31/1884; H01L 21/02271; H01L 31/206; H01L 31/02168
See application file for complete search history.

(56) References Cited

U.S. PATENT DOCUMENTS

| | | | | |
|---|---|---|---|---|
| 5,104,694 A * | 4/1992 | Saito | .................. | C23C 16/0236 257/E21.171 |
| 5,122,391 A * | 6/1992 | Mayer | .................. | C03C 17/002 427/109 |
| 5,124,180 A * | 6/1992 | Proscia | ................. | C03C 17/002 427/255.19 |
| 5,205,851 A * | 4/1993 | Suganuma | ........... | G02B 6/2835 65/411 |
| 5,248,349 A * | 9/1993 | Foote | .................. | H01L 31/1836 118/719 |
| 5,366,764 A * | 11/1994 | Sunthankar | ............. | C23C 14/22 427/248.1 |
| 5,393,563 A * | 2/1995 | Ellis, Jr. | ................. | C03C 17/002 427/167 |
| 5,413,671 A * | 5/1995 | Ketchum | .................. | C23C 16/4405 118/715 |
| 5,501,739 A * | 3/1996 | Yamada | ................. | B05D 1/185 118/715 |
| 5,545,027 A * | 8/1996 | Kaneishi | ............. | B29C 45/1734 264/328.12 |
| 5,690,050 A * | 11/1997 | Doi | ..................... | C23C 16/4401 118/723 IR |
| 5,735,450 A * | 4/1998 | Heim | ..................... | B23K 1/012 228/191 |
| 5,980,991 A * | 11/1999 | Sakamoto | ............. | C03C 17/002 427/374.1 |
| 6,026,589 A * | 2/2000 | Yao | ..................... | C23C 16/4583 34/228 |
| 6,257,478 B1 * | 7/2001 | Straub | .................... | B23K 1/018 228/119 |
| 6,312,569 B1 * | 11/2001 | Suzuki | ............... | C23C 16/4401 118/715 |
| 6,336,775 B1 * | 1/2002 | Morita | ................. | B65G 49/065 198/721 |
| 6,397,634 B1 * | 6/2002 | Takeda | ................ | C03B 23/0254 65/102 |
| 6,453,992 B1 * | 9/2002 | Kim | .................. | C23C 16/45565 118/666 |
| 6,482,331 B2 * | 11/2002 | Lu | .................. | C23C 16/45519 216/67 |
| 6,719,848 B2 * | 4/2004 | Faykosh | ............... | C03C 17/002 118/718 |
| 8,143,074 B2 * | 3/2012 | Day | .................... | C23C 16/4401 118/730 |
| 8,252,619 B2 * | 8/2012 | Schaeffer | ............ | H01L 21/6715 257/E21.068 |
| 8,697,197 B2 * | 4/2014 | Savas | ..................... | C23C 16/24 427/569 |
| 2002/0011161 A1 * | 1/2002 | Jader | ..................... | B41F 21/00 101/232 |
| 2004/0050685 A1 * | 3/2004 | Yara | .................... | C23C 16/4409 204/164 |
| 2004/0111848 A1 * | 6/2004 | Miyamoto | ........ | A61F 13/15699 28/165 |
| 2005/0036861 A1 * | 2/2005 | Buchmann | ............ | B66F 9/0754 414/398 |
| 2007/0045382 A1 * | 3/2007 | Shibamura | ............. | B23K 1/008 228/42 |
| 2007/0120227 A1 * | 5/2007 | Suzuki | ............. | H01L 21/67115 257/620 |
| 2007/0256910 A1 * | 11/2007 | Cavirani | ............. | B65G 47/084 198/419.1 |
| 2008/0000497 A1 * | 1/2008 | Verhaverbeke | ......... | G03F 7/427 134/1.1 |
| 2008/0117402 A1 * | 5/2008 | Best | .................... | H01L 21/67115 355/72 |
| 2008/0233283 A1 | 9/2008 | Choi et al. | | |
| 2008/0260967 A1 * | 10/2008 | Yoon | .................... | C23C 16/4412 427/576 |
| 2008/0268153 A1 * | 10/2008 | Kitagawa | ............. | C23C 16/4412 427/255.29 |
| 2008/0317956 A1 * | 12/2008 | Reber | .................. | C23C 16/4401 427/255.28 |
| 2009/0042404 A1 * | 2/2009 | Surthi | ............... | C23C 16/45546 438/770 |
| 2009/0214784 A1 * | 8/2009 | Von Der Waydbrink | ............ | C23C 14/56 427/255.23 |
| 2010/0218555 A1 * | 9/2010 | Tomioka | ............. | C03B 23/0254 65/29.1 |
| 2010/0267188 A1 | 10/2010 | Parks et al. | | |
| 2011/0088260 A1 * | 4/2011 | Yoshioka | ............... | B22F 7/062 29/888 |
| 2011/0092075 A1 * | 4/2011 | Suzuki | ............... | C23C 16/4584 438/758 |
| 2011/0139073 A1 * | 6/2011 | Reed | .................... | C23C 14/568 118/729 |
| 2011/0143491 A1 * | 6/2011 | Rathweg | ............... | H01L 31/1828 438/84 |
| 2011/0262641 A1 * | 10/2011 | Sferlazzo | ............ | C23C 16/4412 427/255.28 |
| 2011/0269256 A1 * | 11/2011 | Black | .................... | C23C 14/24 438/61 |
| 2011/0303145 A1 * | 12/2011 | Lee | ..................... | C23C 16/4405 118/666 |

(56) References Cited

U.S. PATENT DOCUMENTS

| | | | |
|---|---|---|---|
| 2012/0017833 A1* | 1/2012 | Von Der Waydbrink | B05B 13/0221 118/729 |
| 2012/0027921 A1* | 2/2012 | Feldman-Peabody | C23C 14/0629 427/74 |
| 2012/0028395 A1* | 2/2012 | Feldman-Peabody | C23C 14/24 438/61 |
| 2012/0052617 A1* | 3/2012 | Johnson | C23C 14/0629 438/84 |
| 2012/0060758 A1* | 3/2012 | Feldman-Peabody | C23C 14/0629 118/696 |
| 2012/0167968 A1 | 7/2012 | Lossen et al. | |
| 2012/0178039 A1* | 7/2012 | Kagaya | B23K 1/0016 432/219 |
| 2012/0237695 A1* | 9/2012 | Pye | C08J 7/08 427/554 |
| 2012/0240627 A1* | 9/2012 | Nelson | C03C 17/002 65/32.4 |
| 2012/0240634 A1* | 9/2012 | Sanderson | C03C 17/002 65/60.5 |
| 2012/0319252 A1* | 12/2012 | Yamazaki | C23C 16/40 257/646 |
| 2013/0084669 A1* | 4/2013 | Black | C23C 14/042 438/61 |
| 2013/0098111 A1* | 4/2013 | Xi | H01L 31/0296 65/29.19 |
| 2013/0129570 A1* | 5/2013 | Jung | B01J 8/1809 422/119 |
| 2013/0174379 A1* | 7/2013 | Ishino | A61F 13/15707 19/98 |
| 2013/0220774 A1* | 8/2013 | Werner | B65B 59/00 198/583 |
| 2013/0309416 A1* | 11/2013 | Yokoyama | C23C 16/4412 427/569 |
| 2013/0323421 A1* | 12/2013 | Honma | C23C 14/08 427/248.1 |
| 2014/0037988 A1* | 2/2014 | Ganjoo | H01B 13/0036 428/702 |
| 2014/0227512 A1* | 8/2014 | Smith | C03C 17/245 428/336 |
| 2014/0227883 A1* | 8/2014 | Izumoto | H01L 21/6708 438/745 |
| 2014/0273498 A1* | 9/2014 | Kobayashi | H01L 21/6708 438/745 |
| 2015/0017594 A1* | 1/2015 | Wilson | F23N 3/08 432/23 |
| 2015/0024540 A1* | 1/2015 | Schmid | C23C 16/45521 438/72 |
| 2015/0246845 A1* | 9/2015 | Seki | C03C 17/245 427/255.18 |
| 2015/0318192 A1* | 11/2015 | Ito | H01L 21/67109 438/748 |
| 2015/0382482 A1* | 12/2015 | Hiyama | B23K 1/008 228/42 |

FOREIGN PATENT DOCUMENTS

| | | | | |
|---|---|---|---|---|
| DE | 10 2010 013 032 U1 | | 3/2011 | |
| DE | 10 2011 077 833 A1 | | 12/2012 | |
| EP | 0503382 A1 | * | 9/1992 | ............ C03C 17/002 |
| JP | H 0653140 A | * | 2/1994 | |
| JP | 2000077843 A | * | 3/2000 | |
| JP | 2005330530 A | * | 12/2005 | |
| JP | 2007273854 A | * | 10/2007 | |
| JP | 2009093964 A | * | 4/2009 | |
| JP | 2010098092 A | * | 4/2010 | |

OTHER PUBLICATIONS

German Search Report issued in connection with DE 10 2011 080 202.9.

* cited by examiner

APPARATUS AND PROCESS FOR PRODUCING THIN LAYERS

This application is a national phase of PCT/EP2012/064653, filed Jul. 26, 2012, and claims priority to DE 10 2011 080 202.9, filed Aug. 1, 2011, the entire contents of which are hereby incorporated by reference.

The invention relates to an apparatus for producing thin layers on substrates and also to a process for producing thin layers in a continuous operation using such an apparatus.

It is known to deposit or produce thin layers on substrates also in solar cell production by means of atmospheric pressure chemical vapour deposition (APCVD). On account of relatively high temperatures typically of considerably more than 250° C. for these processes, the substrates to be coated are usually conveyed on metal belts or in carriers. The metal belts usually consist of an alloy based on nickel and chromium, whereas the carriers often consist of carbon composite materials or of graphite. These conveyor systems have to undergo complex cleaning following passage through the coating apparatus, which can be done sequentially or continuously.

In this respect, metal belts additionally have the problem that substrates made of semi-conductor materials, for example silicon and GaAs, experience considerable losses in their performance in the case of contamination with metal. Alternatively, it is necessary to carry out subsequent, very complex cleaning or to avoid the use of the aforementioned carriers. The cleaning steps increase the production costs considerably. For mass production, such as for solar cell production, conveyor systems having carriers are in turn less suitable, since mechanical stress during loading and unloading leads to an increased risk of breakage. This is true primarily for the current trend towards ever thinner substrates in solar cell production, having a thickness of less than 150 micrometers. A further problem of metal belts, which are typically realized as circulating continuous belts, is that the energy demand for belt heating is high in principle. On the one hand, a relatively large mass of belt material has to be heated, and on the other hand the belt cools down again in each case in the region outside the corresponding heating device or the coating portion. This can result in the temperature being limited to approximately 600° C. Some APCVD processes require even higher temperatures, however. In addition, the undesirable effect of what is known as bowing may occur in the case of substrates lying on the hot metal belt, i.e. a bow-like bulge in the solar cell wafers to be coated.

EP 0 503 382 A1 discloses an APCVD system having a circulating conveyor belt, above which a pre-process chamber, a main reaction chamber and a post-process chamber with intermediate nitrogen purge curtains are arranged at a distance apart in the conveying direction. A plurality of heating elements for heating the substrates to be coated up to a temperature of approximately 500° C. are provided underneath the conveyor belt along substantially the entire length between a loading station and an unloading station.

DE 10 2009 041 546 A1 discloses a process for producing solar cells with a selective emitter. To this end, a possible process which is proposed is the production of a doping source, such as phosphosilicate glass (PSG), by means of APCVD and the subsequent realization of a first, slight diffusion step in a tube furnace or continuous furnace with roller, chain belt or lifting bar conveying.

DE 10 2008 030 679 A1 discloses an apparatus for the diffusion treatment of workpieces having a conveyor device, for which, for reasons of temperature and corrosion resistance with respect to the process media used, the use of rollers or cylindrical rolls made of a ceramic material is proposed. A gas feeding device is provided in a reaction region above the conveyor path and is faced by a heating device, e.g. in the form of a surface emitter, underneath the conveyor path.

The applicant's prior patent application DE 10 2011 077 833 describes an APCVD process and a corresponding apparatus for applying an $Al_2O_3$ passivation layer to a substrate, in particular a solar cell silicon wafer, wherein the substrate is conveyed horizontally in continuous operation by means of a conveyor path formed by conveyor rollers.

The invention is based on the object of providing an apparatus for producing thin layers on substrates and also a corresponding process for producing thin layers in continuous operation, with which problems from the prior art can be avoided and in particular versatile usability for any desired APCVD processes is provided.

This object is achieved by providing an apparatus for producing thin layers on substrates, in particular for solar cell production, comprising an APCVD coating apparatus for applying the thin layers by means of an APCVD process at temperatures of more than 250° C., a horizontal conveyor path having conveyor rollers, which consist of a temperature-resistant, non-metallic material, for conveying the substrates in continuous operation, and at least one of a heating device or a purge gas feeding device, which is arranged on that side of the conveyor path which is remote from the APCVD coating apparatus.

This object is further achieved by providing a process for producing thin layers in continuous operation using the apparatus of the invention, wherein, as said thin layer, a dielectric layer a dielectric layer is produced or is applied to a substrate, or a conductive layer is applied to a solar cell, or a doping layer is applied to a solar cell as the substrate, or an anti-reflection layer is applied to a solar cell as the substrate.

It is provided that the layers are applied by an APCVD process at temperatures of more than 250° C. In this case, the substrates are conveyed on a horizontal conveyor path and coated by means of a corresponding coating apparatus in continuous operation. According to the invention, the conveyor path is realized as a roller path, i.e. it has conveyor rollers which are arranged in succession. The conveyor rollers consist of a temperature-resistant, non-metallic material. It is thereby possible to avoid the risk of metal contamination and to solve the problem of the complex cleaning mentioned above. The temperature resistance of the material of the conveyor rollers can be adapted to the intended use or to the temperature to be used for the coating process.

According to the invention, a heating device and/or a purge gas feeding device is or are provided on that side of the conveyor path which is remote from the APCVD coating apparatus, preferably underneath the conveyor path. The heating device can ensure that the substrates to be coated are heated to the required extent from one side, while the layers are applied or the coating is effected on the other side. Suitable heating devices are radiant heating devices, as are known in principle to a person skilled in the art. These can be IR heaters, quartz lamps or the like. The purge gas feeding device can expose the substrates to a so-called purge gas from the side which is remote from the substrate surface to be coated, e.g. from below. It is thereby possible to avoid a situation where an excessive proportion of the stream of gas of the APCVD coating apparatus gets into the roller path or reaches the bottom side of the substrates, where no coating is to take place.

Since the conveyor path is realized as a roller path with rollers which are typically arranged at a distance apart, the substrates can be acted upon very effectively by the heating device and/or by the purge gas feeding device. Purge gas can thus pass through the roller gaps directly onto the substrates, and the heating power of the heating device can likewise be directed through the roller gaps directly and/or also indirectly via the conveyor rollers to the substrates.

It is possible to produce the conveyor rollers from graphite material or fibre composite material, which can withstand high temperatures, with correspondingly temperature-resistant fibres such as carbon fibres, graphite fibres, basalt fibres or aramid fibres. It is thereby possible to also reach temperatures of above 250° C. Advantageously, the conveyor rollers consist of ceramic material or have at least one outer surface or coating which consists of ceramic material. It is particularly advantageous for at least roller bodies of the conveyor rollers to be manufactured entirely from ceramic. In particular, it is possible to also produce further parts of the conveyor path from ceramic material, for example bearings or axles on which the conveyor rollers run. In this case, such axles can either run continuously through conveyor rollers with an appropriate through-bore or else protrude from the conveyor rollers as a journal and be mounted on roller bearings of the conveyor path. It is important in any case that the regions of the conveyor rollers which come into contact with the substrates or are very close to the substrates consist of the temperature-resistant, non-metallic material, in order to avoid the risk of contamination described above.

Many materials are suitable as ceramic materials. It is particularly advantageous to use aluminium oxide, since positive experiences are provided thereby and it is also used generally on a relatively large industrial scale and can be readily processed. It is also at little risk of breakage and mechanically stable. Fibres, in particular ceramic fibres such as basalt fibres, can also be admixed to the ceramic material.

In a further configuration of the invention, at least two such APCVD coating apparatuses are advantageously provided along the conveyor path. It is thereby possible, for example, to deposit a thin layer twice or more often and to thus arrive at a greater overall layer thickness or to accelerate the process. Advantageously, the two coating apparatuses are then at a distance apart, for example two to five times their own passage length. Advantageously, it is possible to provide further heating devices between the coating apparatuses, so that the substrates can also be kept at temperature therebetween.

In one development of the invention, it is possible to preheat the substrates upstream of the first coating apparatus in the direction of passage. This preheating is advantageously effected in turn with a heating device or a radiant heating device. To this end, a type of preheating chamber can particularly advantageously be provided. It is considered expedient to provide a heating device for the preheating above the conveyor path or the substrates, e.g. if the subsequent coating of the substrates is effected on this top side. In addition, it is thereby possible to simplify the structure of the system, particularly also with regard to the structure and the accessibility of the conveyor path or the roller path having the conveyor rollers.

In a manner similar to the above-described preheating chamber, it is also possible to provide for heating of the substrates downstream of the coating apparatus. On the one hand, the coating can thus be retreated, and on the other hand the substrates can be kept at temperature for subsequent coating steps or machining steps.

An aforementioned heated region between two coating apparatuses can advantageously be closed to the outside, effectively in the manner of a preheating chamber for the second coating apparatus, which can have a similar structure to the preheating chamber upstream of the first coating apparatus. Here, too, it is considered advantageous if the heating devices are arranged on the side which faces towards the substrate surface to be coated, e.g. above the conveyor path or the substrates to be coated, whereas, in the region of the coating apparatuses themselves, the heating devices are provided on the other, opposite side, e.g. underneath the conveyor path.

By virtue of the conveyor rollers according to the invention having a surface or a solid material made of non-metallic material which is resistant to high temperatures, the coating apparatus can be designed for deposition temperatures which greatly exceed 600° C. Primarily with the aforementioned ceramic materials for the conveyor path or the conveyor rollers, it is also possible to reach temperatures of above 800° C. or even above 1000° C.

As an alternative to an aforementioned radiant heating system as the heating device, which is operated electrically, it is also possible to provide a heating system with a hot stream of gas or a plasma. For this purpose, it is possible to provide air, nitrogen or another suitable gas mixture. Advantageously, such a heating system is provided with a hot stream of gas outside the APCVD coating apparatus, so as not to influence the coating operations proceeding therein, even if a gas which is used does not interact directly with the coating process.

In a further configuration of the invention, provision can advantageously be made to provide a waste air system on the APCVD coating apparatus. This makes it possible for the coating operation to proceed with less interruption and for the incoming stream of gas to be controlled more effectively.

In respect of the purge gas feeding, it has proved to be advantageous for a plurality of nozzles to be provided, for example nozzles which extend in a slot-like or array-like manner and expose substantially the entire surface area of the substrates to purge gas in the region of the coating apparatuses, e.g. from below. The nozzles can be led through a heating system so that the purge gas is heated before it impinges on the substrates.

In one development of the invention, the purge gas feeding device is designed to direct the purge gas as a temperature-control medium for heating or for cooling onto the substrates. The use of the purge gas as a cooling medium can, in certain applications, prevent undesirable heating effects, such as bulging of the substrates, especially in cases where the substrates are exposed to relatively high coating temperatures on the side thereof which is to be coated. By exposing the opposite substrate side to purge gas, which is at a lower temperature compared to the coating temperature, the substrates can be cooled to a desired extent on the opposite side thereof during the coating process.

In yet another advantageous configuration of the invention, the conveyor path is movable vertically relative to the rest of the apparatus, or the two can be moved apart. It is particularly advantageous if, to this end, the conveyor path can be lowered downwards with the apparatus otherwise remaining stationary. This signifies the lowest possible complexity and the masses to be moved are also relatively small. Cleaning and maintenance work can be carried out on a lowered conveyor path as a result of the significantly better accessibility. In the case of the aforementioned heating and/or purge gas feeding devices arranged underneath the conveyor path in the region of the coating apparatuses, provision can be made for these to be fastened to the conveyor path in such a manner that they are also moved or lowered. This does not represent a problem, however. In this respect, it is also advantageous if heating devices for preheating or otherwise heating the substrates are arranged above the conveyor path, since they then do not interfere with the lowering operation.

By the process according to the invention, a dielectric layer can be produced and applied to a substrate as the thin layer. Advantageously, such a layer is selected from the group consisting of: $SiO_2$, $Al_2O$, SiNx, AlN. It is particularly advantageous that solar cells are coated thereby.

Alternatively, by the process according to the invention, a conductive layer can be applied to a solar cell as the thin layer, for example for contact-connection purposes. This is advantageously a layer of TCO. This is advantageous primarily in the case of solar cells.

As a further alternative, by the process according to the invention, a doping layer can be applied to a solar cell as the substrate. This may be a P doping, a B doping or a Ge doping.

As a further alternative, by the process according to the invention, an anti-reflection layer can be applied as the thin layer to a solar cell as the substrate. It can be selected from the group consisting of: SiNx, MgO, MnO, $TiO_2$, $ZrO_2$, $MoSi_2$.

As has been mentioned, the processes according to the invention and also the associated apparatus are particularly readily suitable for coating thin substrates, since these can generally be conveyed very well and gently on roller paths. This is also the case for ceramic rollers. By inline coating, it is possible to very effectively apply a coating in a short time with a sufficient layer thickness and gentle handling of the substrates to be coated.

These and further features emerge not only from the claims but also from the description and the drawings, where the individual features can be realized in each case by themselves or as a plurality in the form of subcombinations in an embodiment of the invention and in other fields and can constitute advantageous and inherently protectable embodiments for which protection is claimed here. The subdivision of the application into individual sections and subheadings do not restrict the general validity of the statements made thereunder.

Figure 2:
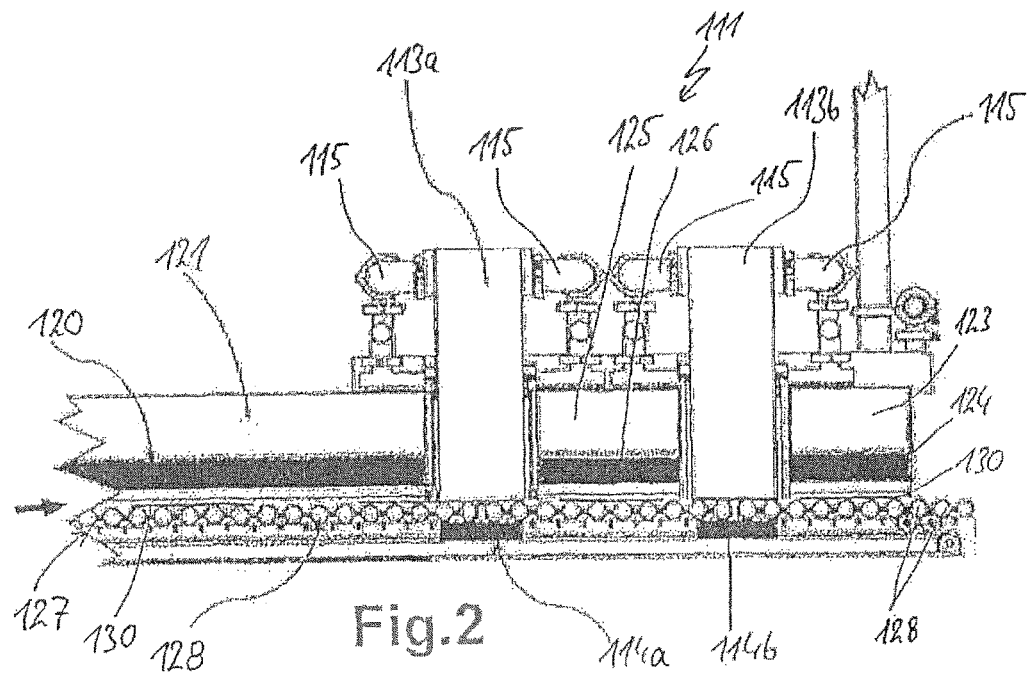
Figure 3:
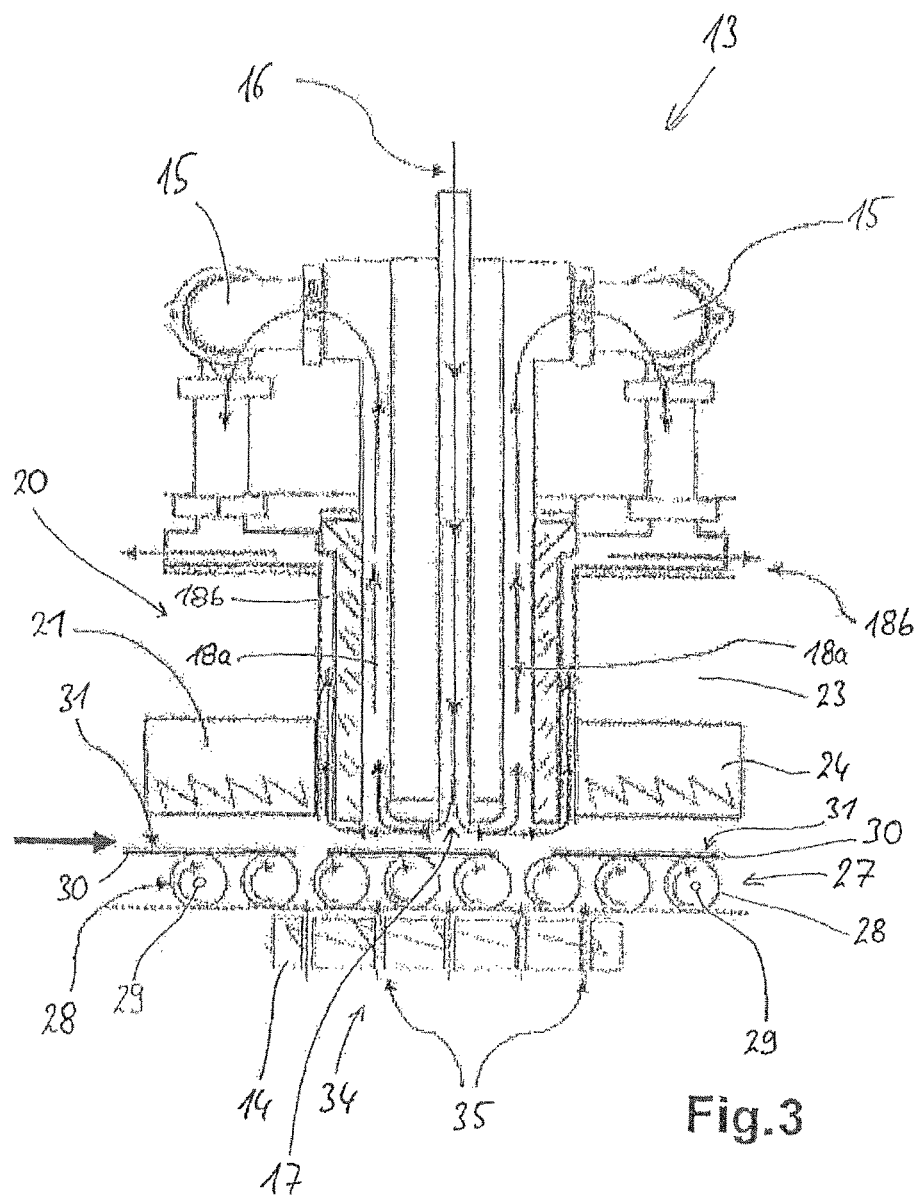
Figure 4:
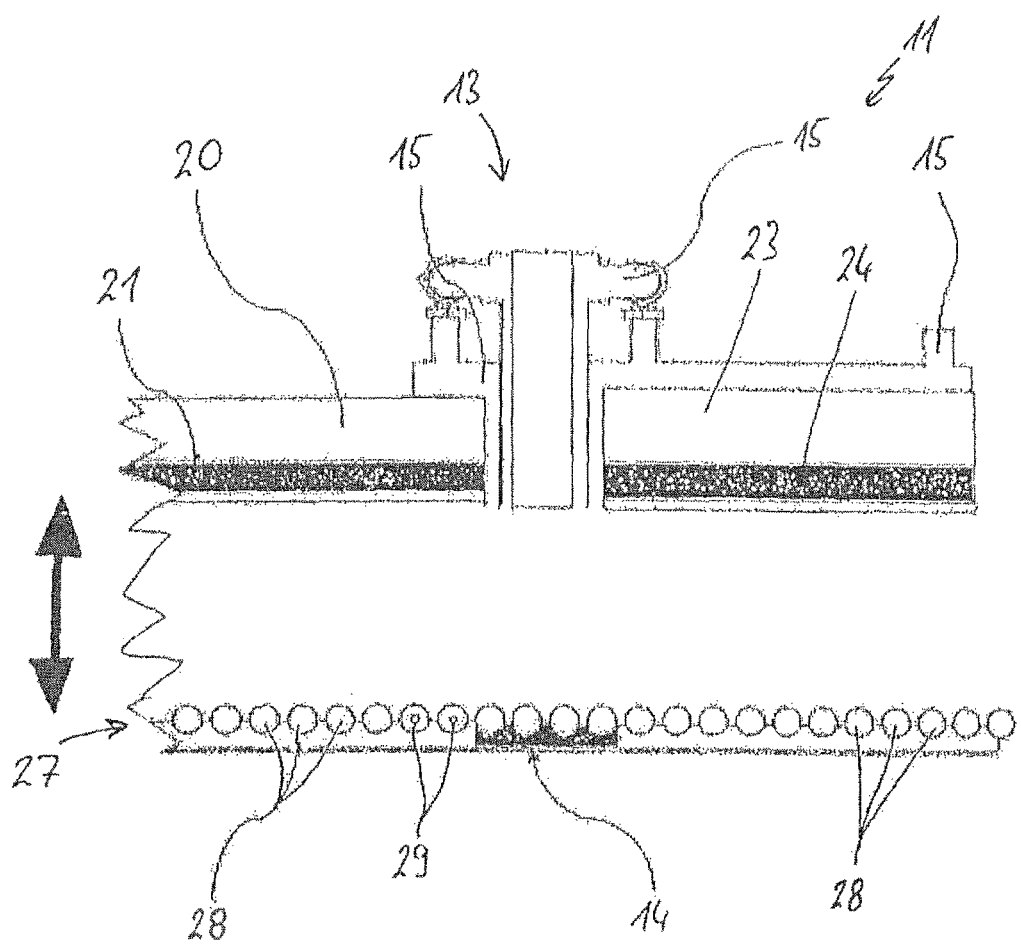

Exemplary embodiments of the invention are shown schematically in the drawings and are explained in more detail hereinbelow. In the drawings:

FIG. 1 shows a coating apparatus according to the invention comprising a single APCVD coating apparatus and a conveyor path having conveyor rollers, FIG. 2 shows a modified apparatus similar to that shown in FIG. 1 comprising two APCVD coating apparatuses, FIG. 3 shows an APCVD coating apparatus in an enlarged sectional view from the side with a gas feed and an enlarged illustration of the conveyor path, and FIG. 4 shows an illustration of the apparatus shown in FIG. 1 with the conveyor path lowered.

FIG. 1 shows an apparatus 11 according to the invention, with which thin layers can be deposited on substrates. In particular, the apparatus 11 can be used for solar cell production. It has an injector 13 as the coating apparatus, as is known for example from DE 10 2011 077 833.

To the left, upstream of the injector 13, provision is made of a preheating chamber 20 with a corresponding heating device 21, whereas a reheating system 23 with a heating device 24 is provided downstream of the injector 13. A conveyor path 27 runs in the bottom region of the apparatus 11 underneath the injector 13 and also the preheating chamber 20 and the reheating system 23. Said conveyor path has individual conveyor rollers 28, with which substrates 30, in particular for solar cell production, can be conveyed gently in the manner described in the introduction. In this case, the substrates 30 merely lie on the conveyor rollers 28 and are conveyed by the latter rotating. This is quite clearly an operation which is as gentle as possible, and therefore even very thin or sensitive substrates 30 can be conveyed and coated. The conveyor rollers 28 are advantageously driven, but this can easily be implemented by a person skilled in the art and is therefore not shown in more detail here. The conveyor rollers 28 rotate in this case on roller axles 29; this is likewise readily conceivable and therefore it does not have to be explained further here. The rollers 28 and the roller axles 29 consist of a ceramic material described above, to be precise of a solid material, in particular aluminium oxide. Alternatively, rollers 28 coated with a ceramic are also conceivable.

Furthermore, a waste air system 15 is provided on the injector 13, and is also provided on the reheating system 23. This is explained in more detail hereinbelow.

A heating device 14 is arranged underneath the injector 13. Whereas the heating devices 21 and 24 act or radiate downwards, in order to heat the substrates 30 conveyed past therebelow, the heating device 14 of the injector 13 is arranged underneath the substrates 30 or the conveyor path 27 and acts upwards. This does not interfere with the coating operation and makes it possible for the substrates to be heated from below during the coating operation which proceeds on the top side thereof.

The modification of an apparatus 111 shown in FIG. 2 shows that two injectors 113a and 113b are provided, with in each case heating devices 114a and 114b thereunder and underneath a conveyor path 127. Similarly, provision is made of a preheating chamber 120 with a corresponding heating device 121 and of a reheating system 123 with a heating device 124. An intermediate heating system 125 with a corresponding heating device 126 is provided between the two injectors 113a and 113b in order to keep the substrates 130 to be coated at temperature on the conveyor path 127. The intermediate heating system 125 can in this case be formed like the preheating chamber 120 or the reheating system 123. This also applies to the heating device 126 thereof, which is in turn arranged above the conveyor path 127 and heats the substrates 130 therebelow.

A waste air system 115 is provided on both injectors 113a and 113b. It also extends down to the conveyor path 127, but this is explained in more detail hereinbelow. In this apparatus 111, too, the conveyor path 127 has conveyor rollers 128. These advantageously have exactly the same design as in FIG. 1.

An enlarged illustration of an injector 13 as the APCVD coating apparatus as shown in FIG. 3 firstly shows, again on an enlarged scale, the conveyor rollers 28 with the roller axles 29, which form the conveyor path 27. The substrates 30 lie on the conveyor path 27 or the conveyor rollers 28 with the substrate top sides 31 thereof facing upwards. In a manner which is not shown, the roller axles 29 can in this case be mounted in lateral roller bearings on a frame or the apparatus 11, as is known per se. Furthermore, these roller axles 29 can run through the conveyor rollers 28 and protrude at both ends. Advantageously, they can also be used in the manner of short axles or be fastened generally in the roller bearings, such that the conveyor rollers 28 are placed thereon only loosely and can rotate thereon together with a drive.

The injector 13 has a gas inlet 16 into which the process gases for the APCVD coating are introduced. This is known per se to a person skilled in the art, see in particular also DE 10 2011 077 833 as mentioned above. The gas inlet 16 extends as far as a gas outlet 17 on the bottom side of the injector 13 or just above the substrate top side 31. There, the process gases then flow sideways away to different gas extractions 18a relatively close to the gas outlet 17 and to a gas extraction 18b at a somewhat greater distance to the outside. The gas extractions 18a and 18b are in this case connected to the aforementioned waste air system 15.

To the left and to the right of the injector 13, the preheating chamber 20 with the heating device 21 and, respectively, the reheating system 23 with the heating device 24 are again shown. The heating devices 21 and 24 in this case heat the substrate top sides 31 just before and just after the coating operation.

A purge gas feeding device 34 with individual purge nozzles 35 is provided underneath the conveyor path 27 underneath the injector 13. Purge gas is introduced into the apparatus 11 through said device, and said purge gas keeps the regions underneath the substrates 30 in the region underneath the injector 13 to some extent free of gas from the gas outlet 17 of the APCVD coating apparatus. Instances of contamination or deposits on the bottom sides of the substrates 30 can thus be avoided.

The above-described heating device 14 of the injector 13 is also arranged in the region of the purge gas feed 34 or the purge nozzles 35. The purge nozzles 35 are led through the heating device 14. In this case, the purge nozzles 35 are formed either as a multiplicity of individual nozzles or as elongate nozzles, in particular slot nozzles or annular nozzles.

After exiting the purge nozzles 35, the purge gas can pass through the gaps between the conveyor rollers 28 directly to the bottom side of the substrates and through gaps between successive substrates 30 into the region above the conveyor path 27. In addition to its designated purging purpose, the purge gas can, if required, perform a temperature-control function, i.e. a heating or cooling function, for the substrates 30. To this end, the purge gas is directed onto the substrates 30 at an appropriate, desired temperature. For this temperature-control application, the purge gas can, if required, be heated up by the heating device 14, in particular upon passage through the purge nozzles 35. Alternatively, the purge gas can be directed onto the substrates 30 without being preheated or after preceding active cooling, in order to cool said substrates on the bottom side, preferably during, shortly before and/or shortly after the coating process proceeding on the top side. For active purge gas cooling, it is possible to use any one of the gas cooling apparatuses known per se for this purpose, and for this reason this does not require more detailed explanations here. As an alternative or in addition to exposing the substrates to heated purge gas on the bottom side, the substrates 30 can also be heated on the bottom side directly by the heating device 14, e.g. by radiant heating through the roller gaps and/or by way of the conveyor rollers 28 themselves.

The heating device 14 and the purge gas feeding device 34 are limited in terms of their extent in the conveying direction substantially to the corresponding extent of the injector 13 arranged opposite above the conveyor path 28. This proves to be sufficient for satisfactory substrate heating, with the optional addition of the heating devices 21, 24 arranged on the top side. Compared to a conventional system with a circulating conveyor belt, the advantage of a considerably higher heating efficiency is obtained in the present case by the roller path. A belt which cools down again upon circulation does not need to be heated, and the conveyor rollers 28 remain in place. In addition, those conveyor rollers 28 which are arranged in the coating region can serve as continuous heat transfer elements and/or can facilitate direct heating of the substrates from below because they are arranged at a distance apart.

With respect to the manner of functioning of the coating, reference is made in turn to DE 10 2011 077 833 as mentioned above.

FIG. 4, finally, once again shows the apparatus 11 shown in FIG. 1. For maintenance purposes, in particular on the conveyor path 27, the latter has been moved downwards or lowered, i.e. also the conveyor rollers 28 together with a bearing (not shown) and the heating device 14 which is fastened thereto and otherwise lies underneath the injector 13. It can readily be seen that the conveyor path 27 or the conveyor rollers 28 can now be maintained or repaired or cleaned very effectively. The conveyor path 27 can be lowered by electric motor, hydraulically or by purely mechanical means. As can be seen clearly from FIG. 4, the heating device 14 can also be lowered without any problems. It is then simply raised again together with the conveyor path 27 after the maintenance work has been carried out.

The invention claimed is:
1. An apparatus for producing thin layers on substrates, in particular for solar cell production, comprising:
   an APCVD coating apparatus for applying the thin layers by means of an APCVD process, said APCVD coating apparatus comprising an injector;
   a horizontal conveyor path having conveyor rollers, which consist of a temperature-resistant, non-metallic material, for conveying the substrates in continuous operation, where the substrates are laid on the conveyor rollers with conveying contact, and
   a heating device and a purge gas feeding device, which are arranged on that side of the conveyor path which is remote from the APCVD coating apparatus and on that side of the conveyor rollers which is remote from the APCVD coating apparatus;
   wherein the purge gas feeding device is designed to expose the substrates to purge gas from below and the heating device is designed to expose the substrates to heat from below at least in a region below the injector;
   wherein the purge gas feeding device is designed to direct the purge gas as a temperature-control medium for heating or for cooling the substrates onto the substrates,
   wherein the purge gas feeding device comprises purge nozzles which are led through the heating device;
   wherein, in the direction of passage, a preheating device for the substrates is provided upstream of the APCVD coating apparatus, adjacent the injector to expose the substrates to heat from above in a region outside and upstream adjacent the injector, and a reheating device for the substrates is provided downstream of the APCVD coating apparatus adjacent the injector to expose the substrate to heat from above in a region outside and downstream adjacent the injector; and
   wherein a waste air system is provided on the respective APCVD coating apparatus, wherein the waste air system includes an inlet positioned in between the respective APCVD coating apparatus and the reheating device, or an inlet positioned in between the preheating device and the respective APCVD coating apparatus, or both.

2. The apparatus according to claim 1, wherein the conveyor rollers consist of a ceramic material or are coated therewith.

3. The apparatus according to claim 2, wherein the conveyor rollers consist of or are coated with aluminum oxide.

4. The apparatus according to claim 1, wherein the APCVD coating apparatus is arranged above the conveyor path and the heating device and the purge gas feeding device are arranged in the region of the APCVD coating apparatus underneath the conveyor path.

5. The apparatus according to claim 1, wherein at least two APCVD coating apparatuses are provided at a predefined distance apart along the conveyor path.

6. The apparatus according to claim 5, wherein a heated region of the conveyor path is provided between any two APCVD coating apparatuses and is provided with a heating device arranged above the conveyor path.

7. The apparatus according to claim 1, wherein the APCVD coating apparatus is designed for deposition temperatures of above 250° C. to about 1000° C.

8. The apparatus according to claim 1, wherein a heating system with a hot stream of gas, preferably air, $N_2$ or a gas mixture is provided as the heating device.

9. The apparatus according to claim 8, wherein the heating system is provided outside the APCVD coating apparatus.

10. The apparatus according to claim 8, wherein the hot stream of gas comprises air, $N_2$ or a gas mixture.

11. The apparatus according to claim 1, wherein the conveyor path can be lowered downwards relative to the rest of the apparatus.

12. The apparatus according to claim 1, wherein the reheating device is provided on the same side of the conveyor path as the APCVD coating apparatus.

* * * * *